United States Patent [19]
Waarts et al.

[11] Patent Number: 4,995,050
[45] Date of Patent: Feb. 19, 1991

[54] DIODE LASER WITH EXTERNAL LENS CAVITY

[75] Inventors: Robert G. Waarts; William Streifer, both of Palo Alto; Donald R. Scifres, San Jose, all of Calif.

[73] Assignee: Spectra Diode Laboratories, Inc., San Jose, Calif.

[21] Appl. No.: 438,600

[22] Filed: Nov. 17, 1989

[51] Int. Cl.$^5$ .................................................. H01S 3/08
[52] U.S. Cl. ........................................ 372/95; 372/99; 372/101; 372/108
[58] Field of Search .................... 372/95, 99, 101, 108, 372/50, 18, 19, 98; 350/96.18, 413, 162.12, 162.19

[56] References Cited

U.S. PATENT DOCUMENTS

| | | | |
|---|---|---|---|
| 3,660,776 | 5/1972 | Yamaka et al. | 372/99 |
| 4,426,707 | 1/1984 | Martin et al. | 372/95 |
| 4,559,627 | 12/1985 | Chun | 372/92 |
| 4,656,641 | 4/1987 | Scifres et al. | 372/103 |

OTHER PUBLICATIONS

C. J. Chang-Hasnain et al., "High Power with High Efficiency in a Narrow Single-Lobed Beam from a Diode Laser Array in an External Cavity", *Applied Physics Letters* 50 (21), May 25, 1987, pp. 1465–1467.
C. J. Chang-Hasnain et al., "Diffraction-Limited Emission from a Diode Laser Array in an Apertured Graded-Index Lens External Cavity", *Applied Physics Letters* 49 (11), Sep. 15, 1986, pp. 614–616.
Josef Berger et al., "Narrow Far-Field Beam from a Y-Junction Laser Array Using a Customized Spatial Filter in an External Cavity", *Conference on Lasers and Electro-Optics*, May 1, 1987, FD5.

*Primary Examiner*—Frank Gonzalez
*Assistant Examiner*—Galen J. Hansen
*Attorney, Agent, or Firm*—Thomas Schneck; Mark Protsik

[57] ABSTRACT

A diode laser external lens cavity configuration having a stripe mirror with two thin parallel stripes placed in front of the two lobes of the arrays for far field output pattern. The configuration includes a diode laser array or broad area laser, a lens system, such as a graded-index lens, disposed in front of the laser's front light emitting facet and the stripe mirror disposed in front of the lens system at the focal plane of the lens. The two stripes are parallel to one another on opposite sides of and equidistant from a vertical reference plane through the lens' center axis. One stripe is highly reflective, while the other is effectively only partially reflective having either a lower stripe reflectivity or shorter length than the first stripe. Other embodiments include a third stripe spaced from and collinear with the second stripe to form an etalon, and a grating in the cavity.

42 Claims, 3 Drawing Sheets

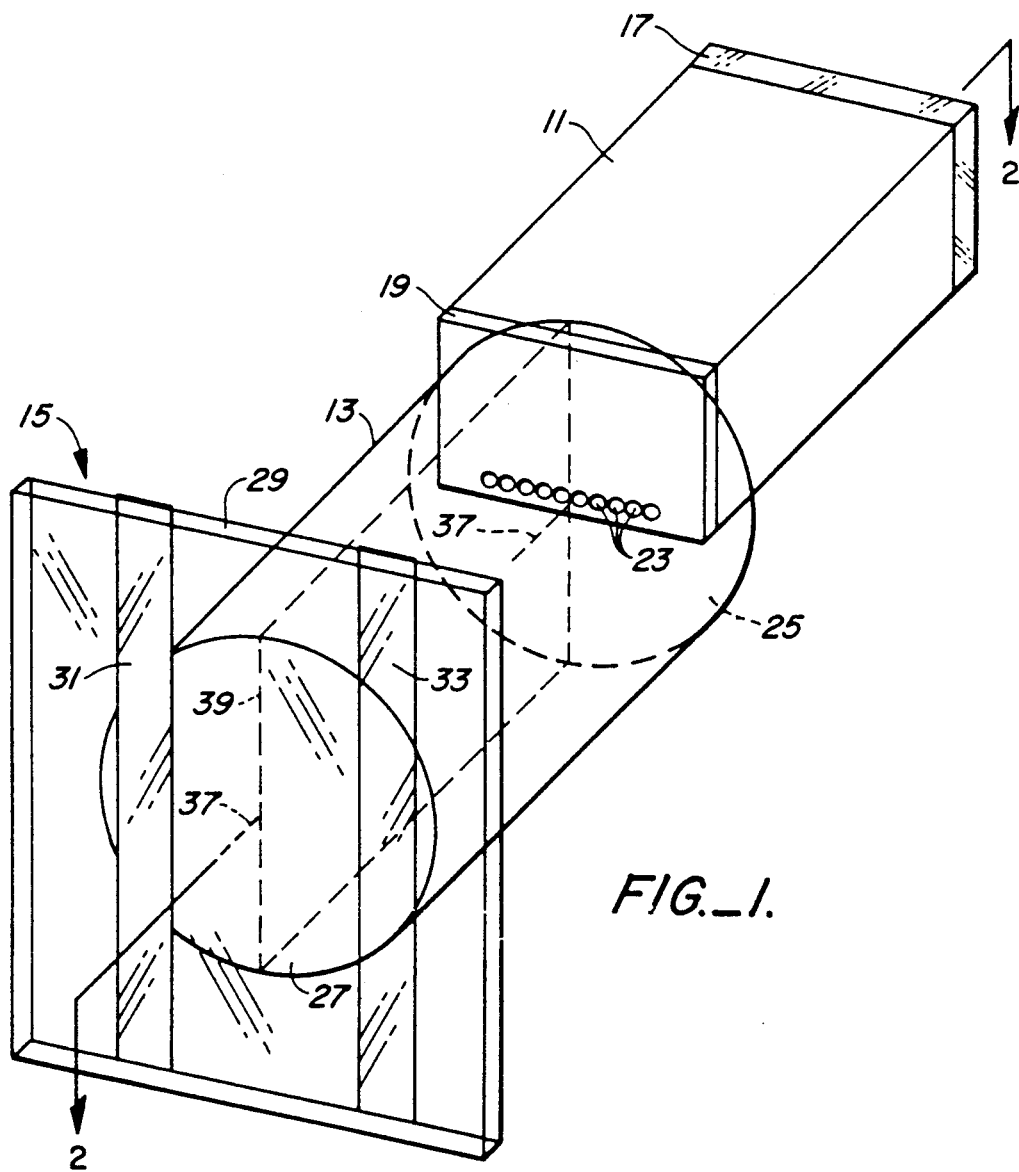
FIG._1.

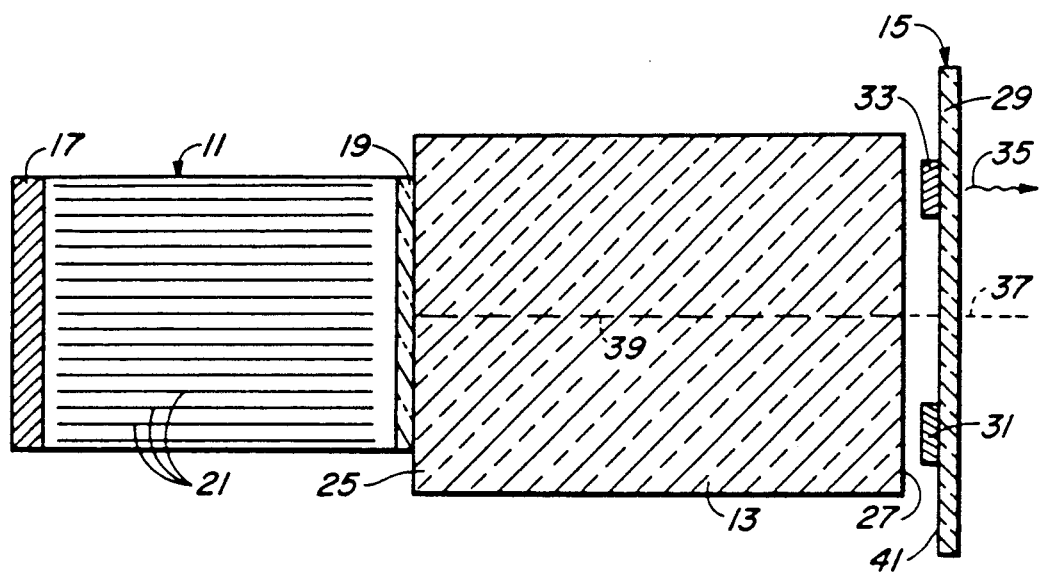
FIG._2.
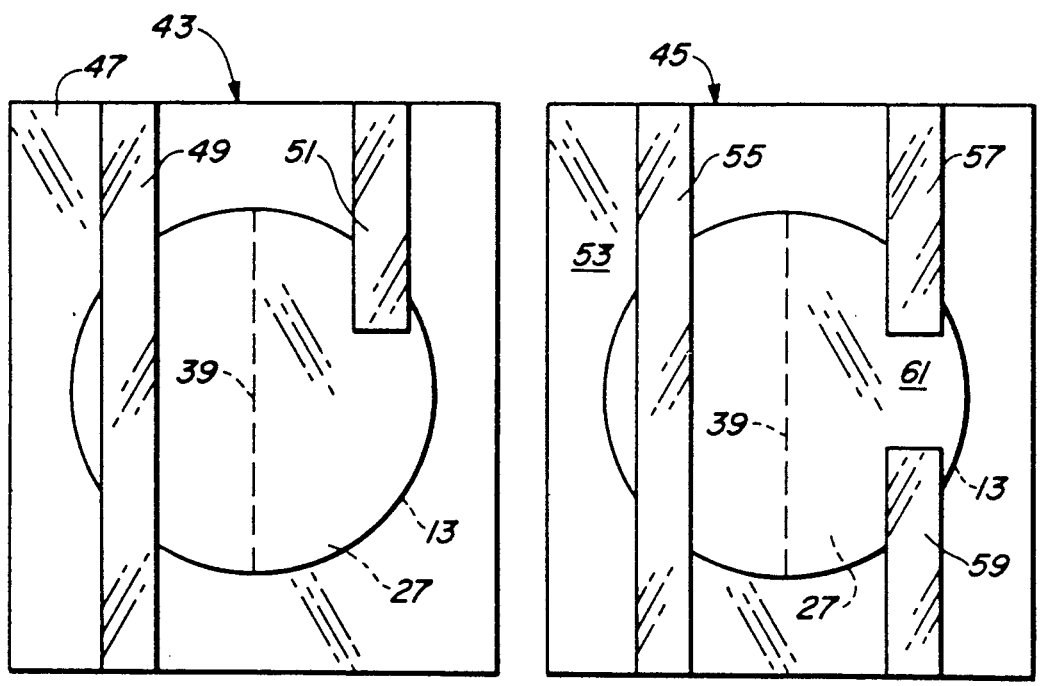
FIG._3.  FIG._4.

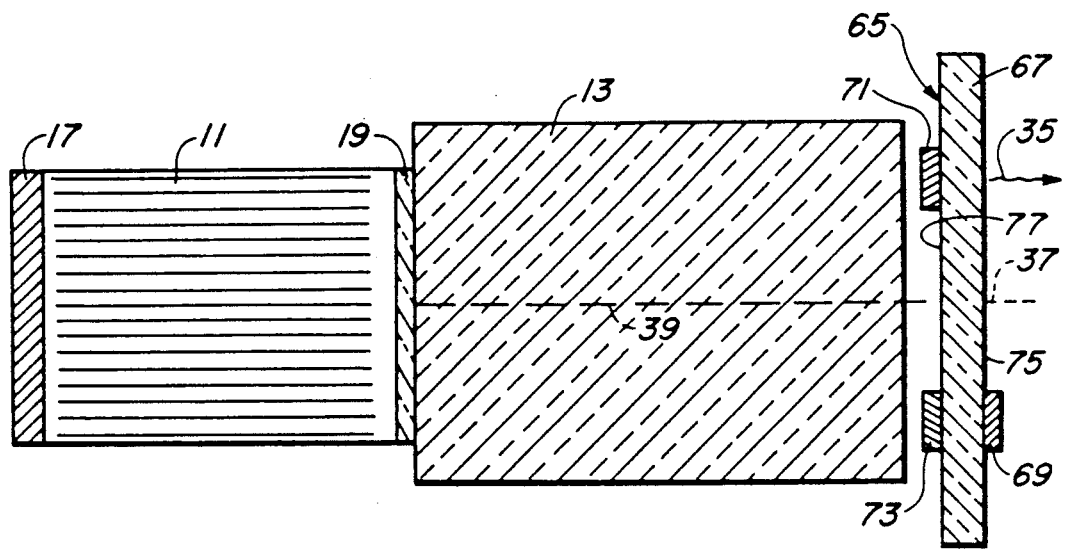
FIG._5.
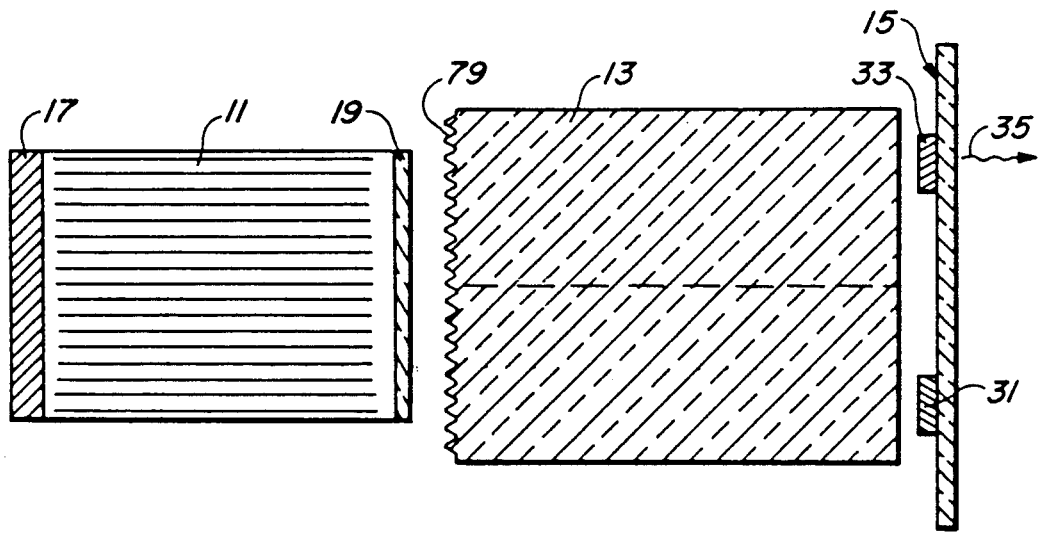
FIG._6.

DIODE LASER WITH EXTERNAL LENS CAVITY

DESCRIPTION

1. Technical Field

The present invention relates to semiconductor diode laser arrays and broad area diode lasers with external resonant cavities, and in particular to such lasers that include an external lens system, such as a graded-index (GRIN) lens, as a cavity component.

2. Background Art

C. J. Chang-Hasnain et al., in *Applied Physics Letters* 50 (21), May 25, 1987, pp. 1465-1467, describe a laser configuration including a diode laser array having a high reflectivity coated back facet on an antireflection coated front facet, a quarter pitch graded-index (GRIN) lens butt coupled at one end to the front facet of the laser array, and an apertured stripe mirror consisting of a single thin gold stripe fabricated on a sapphire substrate placed at the other end of the GRIN lens. In operation, the GRIN lens images the near field of the diode laser array to a far field distribution at the position of the stripe mirror. The laser array prefers to operate in a high order supermode with a two-lobed optical beam in the far field. The thin stripe of the mirror is placed off center so that one lobe of the far field beam is fed back to the array. The high order mode is therefore enhanced and stabilized. In effect, the mirror acts as a spatial filter which selects the modes of the total cavity, thereby obtaining a coherent output. The output is taken from the other lobe, which is already collimated by the GRIN lens.

The above-described laser configuration has an advantage of higher differential efficiency (up to 70%) over other external cavity configurations where the laser arrays are forced to emit in the lowest order or fundamental supermode. This is because the near field pattern of the lowest order supermode does not match the actual current and gain profiles. The present configuration allows the laser array to operate in its naturally preferred mode for greater differential efficiency. Unfortunately, because the stripe mirror has a low effective reflectivity when it is positioned out of the center of the GRIN lens, the threshold pump current is high, leading to a lower overall electrical-to-optical conversion efficiency than might be possible.

Another advantage of the above-described laser array configuration over many others which aim to provide a diffraction limited single lobe far field beam is that the far field beam doesn't steer over a large drive current range.

An object of the present invention is to provide an improved external cavity configuration for a diode laser array or broad area diode laser which retains the advantages of a nonsteering, diffraction limited, single lobe, far field output beam and high differential efficiency, while substantially reducing the threshold pump current and thereby substantially increasing the overall efficiency.

DISCLOSURE OF THE INVENTION

The object has been met with a configuration having a diode laser array or broad area diode laser, a lens system and a stripe mirror, placed in that order, in which the stripe mirror includes two parallel spatially selective reflectors of substantially different effective reflectivities disposed on opposite sides of a center axis of the lens system at its focal plane. The reflective stripes are placed so that they coincide with the two lobes of the far field output pattern at the focal plane of the lens system. By "effective" reflectivity of a stripe we mean the fraction of optical power incident along the length of a stripe, and along the lengths extending from the ends of the stripe to the edges of the lens system, which is reflected back toward the diode laser array. The effective reflectivity is determined by both the actual reflectivity of the stripe and the length of the stripe. The first stripe is a full length high reflectivity (>95%) stripe that feeds back the optical power of one far field lobe toward the diode laser array. The second stripe has either a shorter length, only partial reflectivity or both, and thus a substantially lower effective reflectivity than the first stripe, for partially reflecting light from the second far field lobe back toward the diode laser array. The remaining optical power of the second lobe is output from the laser configuration. The lens system can be a graded-index (GRIN) lens.

Advantages of this configuration include a reduction in the threshold pump current, mainly caused by an increase in the overall effective reflectivity of the entire stripe mirror. Also there is much better longitudinal mode discrimination between the cavity modes, because filtering of the modes is done twice, once by the diode laser array and once by the stripe mirror. The presence of two mirror stripes also improves spatial mode discrimination because the preferred spatial mode now has two feedback sources at the mirror instead of one. Improved mode discrimination reduces the adverse effects, such as mode switching, from imperfect antireflection coatings on cavity surfaces, such as the laser array's front facet and the lens surfaces.

Alternative embodiments can include a third reflective thin stripe, collinear with and spaced apart from the second stripe, the two stripes together having a shorter total length than the first stripe. For even better longitudinal mode discrimination a grating can be added to the laser cavity between the laser array's front facet and the lens system. Alternatively, an etalon can be added to the cavity, as for example by adding a partially reflective stripe on the transparent mirror substrate surface opposite from the first stripe or by adding a partially reflective coating on a graded-index lens opposite from the first stripe.

BRIEF DESCRIPTION OF THE DRAWINGS

FIG. 1 is a perspective view of a first laser configuration of the present invention.

FIG. 2 is a top plan view of the laser configuration of FIG. 1.

FIGS. 3 and 4 are front end views of alternate laser configurations of the present invention.

FIGS. 5 and 6 are side plan views of additional alternate laser configurations of the present invention.

BEST MODE FOR CARRYING OUT THE INVENTION

With reference to FIGS. 1 and 2, a laser configuration of the present invention includes a diode laser array 11, a graded-index (GRIN) lens 13 and an aperture stripe mirror 15. The GRIN lens 13 is positioned in front of the diode laser array 11 and is preferably butt coupled thereto. Similarly, the stripe mirror 15 is placed in front of the GRIN lens 13, and is butt coupled thereto. The mirror stripes can also be deposited directly onto the lens surface. The diode laser array 11 and stripe mirror 15 are aligned with a center axis 37 along the length of the GRIN lens, 13, in a manner to be described below.

The diode laser array 11 may be a ten stripe laser bar, such as a monolithic array of ten GaAs/GaAlAs, multiple quantum well, gain guided, stripe lasers. Such a laser bar is commercially available, as for example the SDL 2410C laser from Spectra Diode Laboratories, Inc. of San Jose, Calif. That laser has 6 μm stripes on 10 μm centers. It has a high reflectivity mirror coating 17 on the back facet with approximately 95% reflectivity and a partial antireflection coating 19 on the front facet with approximately 5% residual reflectivity. It has an output power rating of 100 mW cW and a threshold pump current in the range 250–300 mA in the absence of an external cavity. Without external feedback it operates in a high order supermode ($\gamma = 10$) with a far field pattern of two broad lobes on the order of 1.7° width separated by approximately 4.1°.

Other diode lasers can also be used. In general, laser arrays 11 include a plurality of waveguides 21 therein which define an array of light emitters 23 on the front facet. Alternatively, a broad area diode laser could be used instead of a diode laser array. In either case, the front facet of the laser typically has an antireflection coating 19 thereon, while the back facet has a high reflectivity mirror 17 thereon.

The laser configuration of the present invention includes an external cavity with a lens system, such as a GRIN lens 13. The GRIN lens 13 is typically an 0.25 pitch, 0.6 numerical aperture cylindrical rod lens with an antireflection coating on both ends. Lens 13 has a first end 25 proximate to the laser array 11 for receiving light from the array of emitters 23. Typically, first end 25 is butt coupled to the front facet of laser array 11, but can also be spaced closely apart from the laser array 11. The laser array 11 and GRIN lens 13 are preferably aligned so that the laser emitters 23 are centered on a horizontal line through center axis 37. GRIN lens also has a second end 27 opposite from the first end 25 and proximate to stripe mirror 15. The output light from laser array 11 is collimated by GRIN lens 13. Although a one-quarter pitch GRIN lens is preferred to transform the near field distribution from the laser to a far field pattern, the actual pitch need only be approximate in practice and can vary between 0.20 and 0.30 pitch. A typical GRIN lens for use with diode laser arrays is approximately 3.5 mm long and 2 mm in diameter.

The aperture stripe mirror 15 of FIGS. 1 and 2 includes a transparent substrate 29 onto which a pair of stripes 31 and 33 are placed. Substrate 29 is typically a double-sided polished sapphire substrate. Stripes 31 and 33 are multilayer dielectric coatings or thin metallic films. Stripe 31 should be highly reflective with a reflectivity of about 99% or more, but can be lower. Stripe 33 is partially reflective with a reflectivity in a range of approximately 10–30%. The reflectivity can be controlled by the thickness of the individual dielectric layers, half-wavelength thicknesses resulting in very high reflection and quarter wavelength thicknesses resulting in very low reflection. Reflectivity can also be controlled by the thickness of the thin metallic film, thikcker films resulting in higher reflectivity up to a limit. Preferably, the stripes 31 and 33 are placed on the back side 41 of the mirror substrate 29 nearest the GRIN lens 13.

The optimal stripe width depends on a number of factors, including the width of the laser and the focal length of the lens. A typical lens has a refractive index $n = 1.7$ and a quadratic constant $h = 2.4$ mm. The focal length is then $f = h/n° 1.4$ mm. For a configuration with this lens and a 100 μm wide laser, stripes 31 and 33 are "thin", meaning they have a width in a range from 10 to 30 μm. Thin stripes at the wider end of this range, for example 24 μm, tend to have larger feedback and hence greater mode discrimination than thinner stripes, while thin stripes at the thinner end of the range, for example 16 μm, tend to produce a narrower output beam and a cleaner spatial distribution. The two thin stripes 31 and 33 need not have identical widths. After choosing a width for the first high reflectivity stripe 31, the width of the second partially reflective stripe 33 may be experimentally chosen to minimize threshold pump current, maximize mode discrimination and stability or obtain some desired combination of these characteristics. Similarly, the reflectivity of stripe 33 can also be experimentally selected to achieve one or more of these characteristics.

Stripes 31 and 33 are placed off center so that one lobe of the far field from the laser array 11 is fed back and the other lobe is partially fed back and partially output. Stripes 31 and 33 are aligned substantially parallel to one another and in a generally vertical direction, being substantially parallel to a vertical reference plan 39 through center axis 37 of GRIN lens 13. By "vertical", substantially perpendicular to the horizontal array of laser emitters 23 of laser array 11 is meant, rather than any particular orientation with respect to any objects outside of the laser configuration. Stripes 31 and 33 are also disposed on opposite sides of and equidistant from vertical reference plane 39. A diode laser with an array of 10 μm centers prefers to laser with a double lobed far field pattern, with a separation between lobes in a range from 4 to 7 degrees. Thus, for a 1.4 mm focal length lens, the optimal stripe separation is in a range from 100 μm to 175 μm. The stripe separation selected will depend on the laser array 11, but can easily be optimized by experimentation. In FIGS. 1 and 2, the stripes 31 and 33 are of equal length and extend at least over the entire lens face 27 from top to bottom for maximum effective reflectivity.

With reference to FIGS. 3 and 4, alternative stripe mirrors 43 and 45 are shown, respectively. Stripe mirror 43 in FIG. 3 includes a transparent substrate 47 with first and second thin stripes 49 and 51 disposed thereon. Stripe mirror 43 is like mirror 15 in FIGS. 1 and 2 with the exception of second thin stripe 51. Second stripe 51 is a high reflectivity stripe, unlike the partially reflective stripe 33 of FIGS. 1 and 2. Second stripe 51 has a reflectivity of about 99% or more, i.e. one that is substantially equal to the reflectivity of first stripe 49, and is formed in the same way as first stripe 31 in FIGS. 1 and 2 and first stripe 49 of FIG. 3. Second stripe 51 has a length which is substantially less than the length of first stripe 49. First stripe 49 extends at least over the entire lens face 27 from top to bottom. Second stripe 51, on the other hand, is disposed in front of only a portion of lens face 27, typically in front of only one quadrant of lens face 27. In FIG. 3, second stripe 51 is shown disposed in front of the upper right hand quadrant. Output light is emitted from the lower right quadrant. As in the previous embodiment in FIGS. 1 and 2, the stripes 49 and 51 in FIG. 3 are parallel to one another and disposed on opposite sides of and equidistant from vertical reference plane 39 through the center of GRIN lens 13.

In FIG. 4, alternative stripe mirror 45 includes a transparent substrate 53 with first and second thin stripes 55 and 57 disposed thereon, identical to substrate 47 and stripes 49 and 51 in FIG. 3. Stripe mirror 45 also includes a third thin stripe 59 having high reflectivity and disposed on the substrate 53. This third stripe 59 is spaced apart from and collinear with second stripe 57. Accordingly, third stripe 59 is parallel to first and second stripes 55 and 57, and the three stripes 55, 57 and 59 are equidistant from vertical reference plane 39 through the center axis of GRIN lens 13. The third stripe 59 has a reflectivity of about 99% or higher and is thus substantially equal to the first and second stripes 55 and 57 in reflectivity. Like second stripe 57, the third stripe 59 is typically disposed in front of only one quadrant of the front face 27 of GRIN lens 13. The combined length of stripes 57 and 59 is less than the length of first stripe 55. Output light is emitted through the space 61 between second and third stripes 57 and 59.

An advantage of the alternative stripe mirror configurations 43 and 45 is that they are easier to manufacture than the first stripe mirror embodiment 15 in FIGS. 1 and 2 because all of the reflective stripes have identical reflectivity. A single simple deposition followed by a selective etch can be used, whereas the mirror 15 requires two separate depositions and etches. Another advantage is that a smaller aspect ratio of the output light is achieved with the alternative stripe mirrors 43 and 45 than the first stripe mirror 15.

As in the case of the partially reflective stripe 33 in the first stripe mirror 15, the second stripe 51 or the second and third stripes 57 and 59 may be made narrower or wider than the respective first stripes 49 and 55 in order to optimize efficiency or stability or both.

With reference to FIGS. 5 and 6, the laser configuration of FIGS. 1 and 2 or as modified with an alternative stripe mirror of FIG. 3 or 4, can include an etalon or grating in the external portion of the cavity so as to increase the longitudinal mode discrimination.

In FIG. 5, the laser configuration is like that seen in FIGS. 1 and 2 except that the stripe mirror 15 is replaced by another stripe mirror 65 having an etalon. The laser configuration includes a laser array with a high reflectivity mirror 17 on a rear facet and an antireflection coating 19 on front facet, a graded index lens 13 butt coupled to the laser array 11 and the stripe mirror 65 disposed in front of the GRIN lens 13. Stripe mirror 65 includes a transparent substrate 67 with a first highly reflective thin stripe 69, a second partially reflective thin stripe 71 and a third partially reflective thin stripe 73 all disposed on the transparent substrate 67. The substrate 67 has two major surfaces 75 and 77, and the highly reflective first stripe 69 is disposed on the surface 75 distal from the GRIN lens 13, while the partially reflective second and third stripes 71 and 73 are disposed on the surface 77 proximate to the GRIN lens 13. First and third stripes 69 and 73 are disposed opposite one another so as to define an etalon. Second stripe 71 through which the output light 35 is emitted is parallel to the first and third stripes 69 and 73 on the opposite side of and equidistant from the vertical reference plane 39 through center axis 37 of GRIN lens 13. Typically, first stripe 69 has about 99% or more reflectivity, second stripe 71 has about 20-30% reflectivity and third stripe 73 has about 90% reflectivity. Alternatively, second stripe 71 can be replaced with a high reflectivity strip of substantially shorter length than first stripe 69, as shown in FIGS. 3 and 4.

In FIG. 6, the laser configuration of FIGS. 1 and 2, possibly modified with the stripe mirrors of FIG. 3 or 4, may further include a diffraction grating 79 in the external cavity portion between laser diode array 11 and GRIN lens 13. GRIN lens 13 is preferably spaced apart from the antireflection coated front facet 19 of laser array 11, although it could instead be butt coupled. The grating 79 may be formed by selectively etching the back surface of GRIN lens 13 with an ion beam. Alternatively, the grating 79 may be a separate element from GRIN lens 13 instead of being integrated therewith. Typically, the front light emitting facet 19 of the laser array 11 is not precisely parallel with the grating surface 79, but is disposed at a slight angle thereto which can be adjusted to provide longitudinal mode selection.

The laser configurations of the present invention achieve substantially reduced threshold pump currents over the prior art external cavity configurations. A reduction of 10-15% is typical. Overall efficiency is substantially improved. Likewise, the laser configuration has significantly better mode discrimination over the prior single stripe mirror configuration, resulting in improved stability.

We claim:

1. A laser configuration comprising,
a diode laser having a back facet reflector and a front partially transmitting facet,
a lens system positioned in front of said front facet for transforming a near field distribution of light transmitted through said front facet to a far field pattern, and
means placed in front of said lens system in said far field pattern for reflecting said far field pattern of light in a spatially selective manner back toward said diode laser, said spatially selective reflecting means including a first high reflectivity thin stripe and a second partially reflective and partially transmissive thin stripe, said second thin stripe having a reflectivity that is substantially less than the reflectivity of said first stripe, said first and second thin stripes being positioned in front of lobes of said far field pattern corresponding to a desired laser mode so as to reflect substantially more light of said desired mode than light of other undesired modes, said second thin stripe partially transmitting one lobe of said far field pattern to provide a laser output.

2. The laser configuration of claim 1 wherein the diode laser is a laser array.

3. The laser configuration of claim 1 wherein the diode laser is a broad area laser.

4. The laser configuration of claim 1 wherein said back facet reflector of the diode laser has high reflectivity and said front facet is antireflection coated.

5. The laser configuration of claim 1 wherein the lens system comprises a graded-index (GRIN) lens of approximately one-quarter pitch.

6. The laser configuration of claim 5 wherein said GRIN lens is butted on a first end to the diode laser, and butted on a second end to the spatially selective reflecting means.

7. The laser configuration of claim 5 wherein said reflector sections are affixed to said GRIN lens.

8. The laser configuration of claim 5 wherein said GRIN lens is spaced from said front facet of the diode laser.

9. The laser configuration of claim 1 wherein said first and second thin stripes are positioned spaced apart parallel to one another.

10. The laser configuration of claim 1 wherein said first thin stripe and said second thin stripe are of substantially equal length.

11. A laser configuration comprising,
a diode laser having a back facet reflector and a front partially transmitting facet,
a lens system positioned in front of said front facet for transforming a near field distribution of light transmitted through said front facet to a far field pattern, and
means placed in front of said lens system in said far field pattern for reflecting said far field pattern of light in a spatially selective manner back toward said diode laser, said spatially selective reflecting means including a first high reflectivity thin stripe and a second high reflectivity thin stripe, said second stripe having a reflectivity that is substantially equal to the reflectivity of the first stripe, said second stripe having a length which is substantially less than a length of said first stripe.

12. The laser configuration of claim 11 wherein said spatially selective reflecting means further comprises a third high reflectivity thin stripe, said third stripe being positioned spaced apart from and collinear with said second stripe, a sum of lengths of said second and third stripes being substantially less than the length of said first stripe.

13. The laser configuration of claim 1 wherein said spatially reflecting means includes a transparent substrate with opposed major surfaces, said stripes being disposed on said substrate major surfaces.

14. A laser configuration comprising,
a diode laser having a back facet reflector and a front partially transmitting facet,
a lens system positioned in front of said front facet for transforming a near field distribution of light transmitted through said front facet to a far field pattern, and
means placed in front of said lens system in said far field pattern for reflecting said far field pattern of light in a spatially selective manner back toward said diode laser, said spatially selective reflecting means including a transparent substrate with opposed major surfaces, a first high reflectivity thin stripe disposed on said transparent substrate on a major surface distal from said lens system, a second thin stripe disposed on said transparent substrate on said major surface distal from said lens system, said first and second thin stripes being positioned spaced apart parallel to one another on opposite sides of and equidistant from a center axis of the lens system, said second thin stripe having a reflectivity and length such that an effective reflectivity thereof is substantially less than the reflectivity of said first stripe, a third partially reflective thin stripe disposed on said transparent substrate on a major surface proximate to said lens system, said first stripe being disposed immediately opposite from said third stripe, said first and third stripes defining an etalon.

15. A laser configuration comprising,
a diode laser having a back facet reflector and a front partially transmitting facet,
a lens system positioned in front of said front facet for transforming a near field distribution of light transmitted through said front facet to a far field pattern,
a diffraction grating between said front facet of the laser diode and said lens system, and
means placed in front of said lens system in said far field pattern for reflecting said far field pattern of light in a spatially selective manner back toward said diode laser.

16. The laser configuration of claim 15 wherein said diffraction grating is defined in an end surface of a graded-index (GRIN) lens of said lens system.

17. A laser configuration comprising,
a diode laser having a back facet with a high reflectivity mirror thereon and a front light emitting facet with an antireflection coating thereon,
a graded index lens having a first end positioned in front of said front facet proximate thereto for receiving light from said diode laser, said lens also having a second end opposite from said first end, and
a stripe mirror placed in front of said second end of said graded index lens in a focal plane of said lens, said stripe mirror including a transparent mirror substrate, a first high reflectivity thin stripe disposed on said mirror substrate and a second partially reflective thin stripe disposed on said mirror substrate, said first and second stripes being disposed in front of lobes of a far field pattern of said light from said diode laser corresponding to a desired laser mode so as to reflect a substantial portion of light of said desired laser mode while reflecting substantially less light of other laser modes, said first thin stripe and said second thin stripe being of substantially equal length, said second partially reflective thin stripe having a reflectivity that is substantially less than the reflectivity of said first thin stripe.

18. A laser configuration comprising,
a diode laser having a back facet with a high reflectivity mirror thereon and a front light emitting facet with an antireflection coating thereon,
a graded index lens having a first end positioned in front of said front facet proximate thereto for receiving light from said diode laser, said lens also having a second end opposite from said first end, and
a stripe mirror placed in front of said second end of said graded index lens in a focal plane of said lens, said stripe mirror including a transparent mirror substrate, a first high reflectivity thin stripe disposed on said mirror substrate and a second high reflectivity thin stripe disposed on said mirror substrate, said second stripe having a reflectivity that is substantially equal to the reflectivity of said first stripe, said second stripe having a length which is substantially less than a length of said first stripe, said first and second thin stripes being disposed spaced apart parallel to one another on opposite sides of and equidistant from a plane through a center axis of said graded index lens, said second stripe being disposed at only one quadrant of a focal plane of said graded index lens.

19. The laser configuration of claim 18 wherein said stripe mirror further includes a third high reflectivity thin stripe disposed on said mirror substrate, said third stripe being disposed spaced apart from and collinear with said second stripe, a sum of lengths of said second and third stripes being substantially less than said length of said first stripe.

20. A laser configuration comprising,
   a diode laser having a back facet with a high reflectivity mirror thereon and a front light emitting facet with an antireflection coating thereon,
   a graded index lens having a first end positioned in front of said front facet proximate thereto for receiving light from said diode laser, said lens also having a second end opposite from said first end, and
   a stripe mirror placed in front of said second end of said graded index lens in a focal plane of said lens, said stripe mirror including a transparent mirror substrate having opposed major surfaces, a first high reflectivity thin stripe disposed on a major surface of said mirror substrate distal from said graded index lens, a second thin stripe disposed on a major surface of said mirror substrate, said first and second thin stripes being disposed spaced apart parallel to one another on opposite sides of and equidistant from a plane through a center axis of said graded index lens, said second thin stripe having a reflectivity and length such that an effective reflectivity thereof is substantially less than the reflectivity of said first thin stripe, and a third partially reflective thin stripe disposed on said mirror substrate on a major surface proximate to said graded index lens, said first stripe being disposed immediately opposite from said third stripe, said first and third stripes defining an etalon.

21. The laser configuration of claim 17 wherein said first end of said graded index lens is butt coupled to said front facet of said diode laser.

22. The laser configuration of claim 17 wherein said first end of said graded index lens is spaced from said front facet of said diode laser.

23. A laser configuration comprising,
   a diode laser having a back facet with a high reflectivity mirror thereon and a front light emitting facet with an antireflection coating thereon,
   a graded index lens having a first end positioned in front of said front facet proximate thereto for receiving light from said diode laser, said lens also having a second end opposite from said first end, said first end of said graded index lens being spaced from said front facet of said diode laser,
   a diffraction grating between said front facet of said diode laser and said first end of said graded index lens, and
   a stripe mirror placed in front of said second end of said graded index lens in a focal plane of said lens, said stripe mirror including a transparent mirror substrate, a first high reflectivity thin stripe disposed on said mirror substrate and a second thin stripe disposed on said mirror substrate, said first and second thin stripes being disposed spaced apart parallel to one another on opposite sides of and equidistant from a plane through a center axis of said graded index lens, said second thin stripe having a reflectivity and length such that an effective reflectivity thereof is substantially less than the reflectivity of said first thin stripe.

24. The laser configuration of claim 17 wherein said diode laser is a laser array.

25. The laser configuration of claim 17 wherein said diode laser is a broad area laser.

26. A laser configuration comprising,
   a diode laser having a back facet with a high reflectivity mirror thereon and a front light emitting facet with an antireflection coating thereon,
   a lens system having a first end optically coupled to said front facet of said diode laser, said lens system also having a second end opposite from said first end,
   a stripe mirror placed in front of said second end of said lens system, said stripe mirror including a transparent mirror substrate, a first high reflectivity thin stripe disposed on said mirror substrate and a second partially reflective thin stripe disposed on said mirror substrate, said first and second thin stripes being positioned so as to reflect preferentially one laser mode relative to each other possible laser mode.

27. The laser configuration of claim 26 wherein said stripe mirror further includes a third partially reflective thin stripe disposed on said substrate, said mirror substrate having opposed major surfaces with said third stripe being disposed on a surface proximate to said lens system and said first stripe being disposed opposite from said third stripe on a surface distal from said lens system, said first and third stripes defining an etalon.

28. The laser configuration of claim 26 wherein said lens system comprises a graded-index lens.

29. The laser configuration of claim 26 wherein said diode laser is a laser array.

30. The laser configuration of claim 26 wherein said diode laser is a broad area laser.

31. A laser configuration comprising,
   a diode laser having a back facet with a high reflectivity mirror thereon and a front light emitting facet with an antireflection coating thereon,
   a lens system having a first end optically coupled to said front facet of said diode laser, said lens also having a second end opposite from said first end,
   a stripe mirror placed in front of said second end of said lens system, said stripe mirror including a transparent mirror substrate, a first high reflectivity thin stripe of a first length disposed on said mirror substrate and a second high reflectivity thin stripe of a second length disposed on said mirror substrate, said second length being substantially shorter than said first length, said first and second stripes being disposed parallel to one another on opposite sides of and equidistant from a plane through a center axis of said lens system, said second stripe being disposed at only one quadrant of a focal plane of said lens system.

32. The laser configuration of claim 31 further comprising a third high reflectivity thin stripe of a third length disposed on said mirror substrate, a sum of said second and third lengths being shorter than said first length, said third stripe being disposed spaced apart from and collinear with said second stripe.

33. The laser configuration of claim 31 wherin said lens system is a graded-index lens.

34. The laser configuration of claim 31 wherein said diode laser is a laser array.

35. The laser configuration of claim 31 wherein said diode laser is a broad area laser.

36. A laser configuration comprising,
   a diode laser having a back facet with a high reflectivity mirror thereon and a front light emitting facet with an antireflection coating thereon,
   a graded index lens having a first end spaced proximately in front of said front facet of said diode laser array and having a second end opposite from said first end, a diffraction grating between said front facet of said diode laser and said first end of said graded index lens, a stripe mirror placed in front of said second end of said graded index lens, said stripe mirror including a transparent mirror substrate, a first high reflectivity thin stripe disposed on said mirror substrate and a second partially reflective thin stripe disposed on said mirror substrate, said first and second stripes being disposed parallel to one another on opposite sides of and equidistant from a center axis of said graded index lens.

37. The laser configuration of claim 36 wherein said diffraction grating is defined on said first end of said graded index lens.

38. The laser configuration of claim 1 wherein said first and second thin stripes are positioned spaced apart on opposite sides of and equidistant from a plane through a center axis of the lens system.

39. The laser configuration of claim 11 wherein said second stripe is positioned at only one quadrant of the focal plane of said lens system.

40. The laser configuration of claim 15 wherein said spatially selective reflecting means includes multiple reflector sections, one of said reflector sections having an effective reflectivity which is substantially less than each other reflector section.

41. The laser configuration of claim 17 wherein said first and second thin stripes are parallel to one another on opposite sides of and equidistant from a plane through a center axis of said graded index lens.

42. The laser configuration of claim 26 wherein said first and second thin stripes are parallel to one another on opposite sides of and equidistant from a plane through a center axis of said graded index lens.

* * * * *